(12) United States Patent
Xu

(10) Patent No.: US 9,799,681 B2
(45) Date of Patent: Oct. 24, 2017

(54) PANEL STRUCTURES OF FLAT DISPLAYS AND MANUFACTURING METHODS

(71) Applicant: Shenzhen China Star Optoelectronics Technology Co., Ltd., Shenzhen, Guangdong (CN)

(72) Inventor: Hongyuan Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 58 days.

(21) Appl. No.: 14/905,862

(22) PCT Filed: Aug. 28, 2015

(86) PCT No.: PCT/CN2015/088365
§ 371 (c)(1),
(2) Date: Jan. 18, 2016

(87) PCT Pub. No.: WO2017/012174
PCT Pub. Date: Jan. 26, 2017

(65) Prior Publication Data
US 2017/0229481 A1    Aug. 10, 2017

(30) Foreign Application Priority Data
Jul. 21, 2015    (CN) .......................... 2015 1 0432536

(51) Int. Cl.
*H01L 27/12*    (2006.01)

(52) U.S. Cl.
CPC ........ *H01L 27/124* (2013.01); *H01L 27/1288* (2013.01)

(58) Field of Classification Search
CPC ... H01L 27/12; H01L 27/124; H01L 27/1288; H01L 27/127; H01L 27/3223
See application file for complete search history.

(56) References Cited

U.S. PATENT DOCUMENTS

2009/0167733 A1    7/2009  Lee
2011/0310335 A1*  12/2011  Hashimoto ....... G02F 1/133707
                                                            349/96
(Continued)

FOREIGN PATENT DOCUMENTS

CN        1693973 A    11/2005
CN      102866552 A     1/2013
(Continued)

*Primary Examiner* — Phuc Dang
(74) *Attorney, Agent, or Firm* — Andrew C. Cheng

(57) ABSTRACT

The present disclosure discloses a panel structure of flat displays and the manufacturing method thereof. The panel structure includes a first signal line, a second signal line, a transparent conductive film, and a scanning line. The transparent conductive film includes a first branch, a second branch, and a third branch. A first end of the first branch and a first end of the second branch are connected by a predetermined first angle, and a second end of the second branch and a first end of the third branch are connected by a predetermined second angle. The first branch, the second branch, and the third branch form the arch-shaped frame. The first signal line connects to the second end of the first branch, and the second signal line connects to the second end of the third branch. The scanning line passes through the arch-shaped frame along a first direction.

14 Claims, 3 Drawing Sheets

(56) References Cited

U.S. PATENT DOCUMENTS

| | | | |
|---|---|---|---|
| 2013/0049118 A1* | 2/2013 | Katsuhara | H01L 51/105 257/347 |
| 2013/0215370 A1* | 8/2013 | Takanishi | H01L 27/1225 349/139 |
| 2015/0221705 A1* | 8/2015 | Amano | H01L 27/3223 257/72 |

FOREIGN PATENT DOCUMENTS

| | | |
|---|---|---|
| CN | 103985714 A | 8/2014 |
| CN | 104571720 A | 4/2015 |
| KR | 20060077473 A | 7/2006 |

* cited by examiner

PANEL STRUCTURES OF FLAT DISPLAYS AND MANUFACTURING METHODS

CROSS REFERENCE

This application claims the priority of Chinese Patent Application No. 201510432536.5, entitled "Panel structures of flat displays and manufacturing methods", filed on Jul. 21, 2015, the disclosure of which is incorporated herein by reference in its entirety.

FIELD OF THE INVENTION

The present invention relates to a liquid crystal display technology field, and more particularly to a panel structure of flat displays and a manufacturing method.

BACKGROUND OF THE INVENTION

LCDs (Liquid crystal displays) are popular flat panel displays, and are mainly accomplished by adjusting the LCD backlight intensity. LCDs may include an array substrate, a Color Filter (CF) substrate, and a liquid crystal layer sandwiched there between. In order to improve the display quality of LCDs, the RGB photoresist are directly coating between the pixel electrode of the transparent conductive film of the array substrate and the second metallic layer to increase the distance between the pixel electrode and the signal lines. In this way, the parasitic capacitance between the pixel electrode and the signal lines may be decreased so as to decrease the signal delay of the panel. However, as the distance between the pixel electrode and the signal line is small, the overlap portion of the pixel electrode and the signal lines may generate a larger parasitic capacitance, which causes the signal delays of the signal lines and the scanning lines. In addition, the signals may be deformed in the end of the lines, and the display performance may be affected.

SUMMARY OF THE INVENTION

The technical issue that the embodiment of the present disclosure solves is to provide a panel structure of flat displays and a manufacturing method to further improve the panel structures.

In one aspect, a panel structure of flat displays includes: a first signal line, a second signal line, a transparent conductive film, and a scanning line, the transparent conductive film includes a first branch, a second branch, and a third branch, a first end of the first branch and a first end of the second branch are connected by a predetermined first angle, a second end of the second branch and a first end of the third branch are connected by a predetermined second angle, the first branch, the second branch, and the third branch form the arch-shaped frame, the first signal line connects to the second end of the first branch, the second signal line connects to the second end of the third branch, the scanning line passes through the arch-shaped frame along a first direction and has not intersected with the arch-shaped frame.

Wherein the panel structure further includes a gate insulation layer deposited on a predetermined substrate of the scanning line.

Wherein the panel structure further includes a passivation layer deposited on the gate insulation layer.

Wherein the panel structure further includes a photoresist layer deposited on the passivation layer.

Wherein a thickness of the photoresist layer is in a range between 1 and 1.5 um.

Wherein a thickness of the passivation layer is in a range of (300+n) um or (300−n) um, wherein n is a real number larger than 0 and smaller than 50.

Wherein a thickness of the gate insulation layer is in a range of (500+n) um or (500−n) um, wherein n is a real number larger than 0 and smaller than 50.

Wherein the predetermined first angle and the predetermined second angle are in the range between 30 and 60 degrees.

The panel structure includes: a first signal line, a second signal line, a transparent conductive film, and a scanning line. The transparent conductive film includes a first branch1, a second branch, and a third branch. A first end of the first branch1 and a first end of the second branch are connected by a predetermined first angle. A second end of the second branch and a first end of the third branch are connected by a predetermined second angle. The first branch1, the second branch, and the third branch form the arch-shaped frame. The first signal line connects to the second end of the first branch1, the second signal line connects to the second end of the third branch, the scanning line passes through the arch-shaped frame along a first direction and is not intersected with the arch-shaped frame. In this way, the distance between the signal line and the scanning line is increased. The parasitic capacitance generated in the overlap portions of the signal line and the scanning line may be decreased so as to enhance the display performance.

BRIEF DESCRIPTION OF THE DRAWINGS

In order to more clearly illustrate the embodiments of the present disclosure or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the present disclosure, by configuring an arch-shaped frame, which is made by a transparent conductive film, to connect a first signal line and a second signal line in the overlap location of the signal line and the scanning line. In this way, the distance between the signal line and the scanning line is increased. The parasitic capacitance generated in the overlap portions of the signal line and the scanning line may be decreased so as to enhance the display performance.

Figure 1:
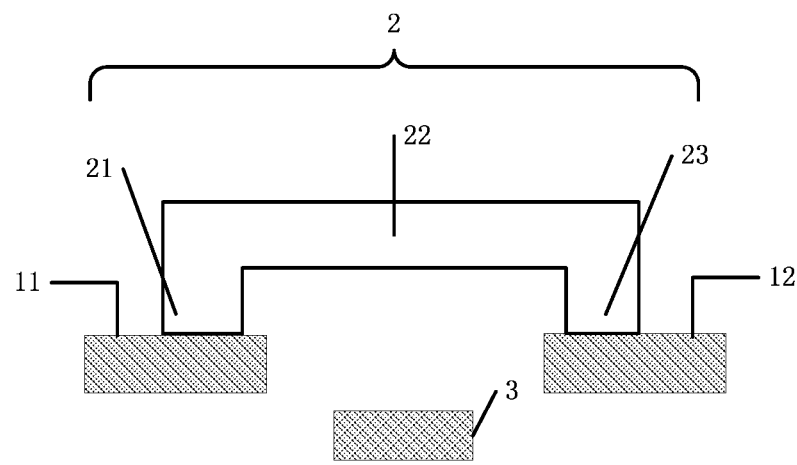
FIG. 1 is a cross-sectional view of the panel structure of the flat display in accordance with one embodiment.

FIG. 1 is a cross-sectional view of the panel structure of the flat display in accordance with one embodiment. As shown, the panel structure includes a first signal line 11, a second signal line 12, a transparent conductive film 2, and a scanning line 3. The transparent conductive film 2 includes a first branch 21, a second branch 22, and a third branch 23. A first end of the first branch 21 and a first end of the second branch 22 are connected by a predetermined first angle. A second end of the second branch 22 and a first end of the third branch 23 are connected by a predetermined second angle. The first branch 21, the second branch 22, and the third branch 23 form the arch-shaped frame. The first signal line 11 connects to the second end of the first branch 21, the second signal line 12 connects to the second end of the third branch 23, the scanning line 3 passes through the arch-shaped frame along a first direction and is not intersected with the arch-shaped frame.

Figure 1A:
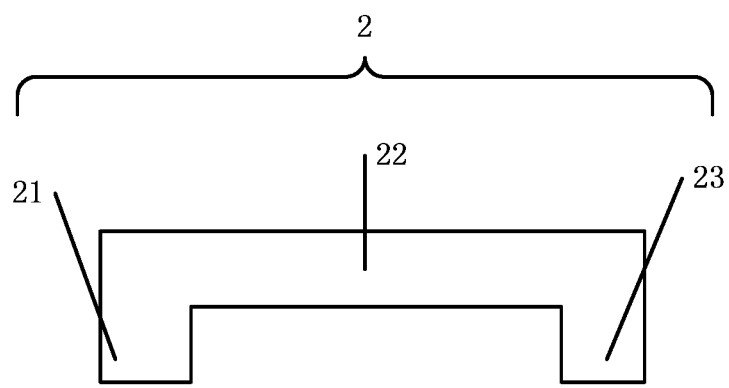
FIG. 1a is a schematic view of the arch-shaped frame in accordance with one embodiment.

In the embodiment, the overlap portion of the signal line and the scanning line of the panel structure id described. As shown in FIG. 1, in the overlap portion, the first signal line 11 and the second signal line 12 are connected by the arch-shaped frame made by transparent conductive film. FIG. 1a is a schematic view of the arch-shaped frame in accordance with one embodiment. The arch-shaped frame includes the first branch 21, the second branch 22, and the third branch 23 made by the transparent conductive film 2. In the embodiment, the first branch 21 and the second branch 22 are connected by the predetermined first angle, and the second branch 22 and the third branch 23 are connected by the predetermined second angle. The arch-shaped frame is integrally formed by the first branch 21, the second branch 22, and the third branch 23. As shown in FIG. 1a, the first branch 21 and the second branch 22 are seamlessly connected, and the second branch 22 and the third branch 23 are seamlessly connected. The relationship between the first branch 21, the second branch 22, and the third branch 23 may be described as: the second branch 22 is a main body, and the first branch 21 and the third branch 23 are two branches connected by the predetermined angle. The predetermined first angle and the predetermined second angle are in the range between 30 and 60 degrees, and the predetermined first angle and the predetermined second angle are not necessarily the same. As FIG. 1a is a cross-sectional view, and thus the angle may not be clearly shown. The first signal line 11 and the second signal line 12 are connected by the arch-shaped frame made by the transparent conductive film 2 in the overlap portion of the signal line and the scanning line. In this way, the distance between the signal line and the scanning line is increased. The parasitic capacitance generated in the overlap portions of the signal line and the scanning line may be decreased so as to enhance the display performance.

In the embodiment, the transparent conductive film 2 is a film, which is electrically conductive and includes a high transmission rate within the range of visible lights, such as a metal film, an oxide film, other compounded films, a polymer film, a composite film, and etc. The metal film is characterized by good electrical conduction, but bad transmission rate, and the semiconductor film is characterized by bad electrical conduction and high transmission rate. Currently, the most widely used films are metal film and an oxide film. The transparent conductive film is mainly used for the photovoltaic device (e.g., thin film solar cells, etc.) Common transparent conductive thin film is ITO, wherein the main ingredient of ITO is indium tin oxide. When the thickness is only a few thousand angstroms, indium oxide has high transmittance rate, and tin oxide has high conductive ability. ITO glasses are the conductive glasses having high transmittance. Because ITO is highly absorbent, it will absorb moisture and carbon dioxide in the air and produce a chemical reaction and deterioration, commonly known as "moldy," and thus the moisture issue has to be considered. ITO has appropriate shielding effectiveness within the range of 150 KHz~1 GHz, and the transparency of ITO is much better than common mesh material shielding glass, such as the light transmission rate can reach more than 85%.

In the embodiment, the scanning line 3 passes through the arch-shaped frame along the first direction, and the scanning line 3 has not intersected with the arch-shaped frame. As shown in FIG. 1, the first direction is below the arch-shaped frame. When the viewing angle is different, the first direction may be different. By configuring an arch-shaped frame, which is made by a transparent conductive film, to connect a first signal line and a second signal line in the overlap location of the signal line and the scanning line. In this way, the distance between the signal line and the scanning line is increased. The parasitic capacitance generated in the overlap portions of the signal line and the scanning line may be decreased so as to enhance the display performance.

In the embodiment, the arch-shaped frame may be an U-shaped frame having sharp corners, or may be an U-shaped frame having an arc.

As shown in FIG. 1, the panel structure includes: a first signal line 11, a second signal line 12, a transparent conductive film 2, and a scanning line 3. The transparent conductive film 2 includes a first branch 21, a second branch 22, and a third branch 23. A first end of the first branch 21 and a first end of the second branch 22 are connected by a predetermined first angle. A second end of the second branch 22 and a first end of the third branch 23 are connected by a predetermined second angle. The first branch 21, the second branch 22, and the third branch 23 form the arch-shaped frame. The first signal line 11 connects to the second end of the first branch 21, the second signal line 12 connects to the second end of the third branch 23, the scanning line 3 passes through the arch-shaped frame along a first direction and is not intersected with the arch-shaped frame. In this way, the distance between the signal line and the scanning line is increased. The parasitic capacitance generated in the overlap portions of the signal line and the scanning line may be decreased so as to enhance the display performance.

Figure 2:
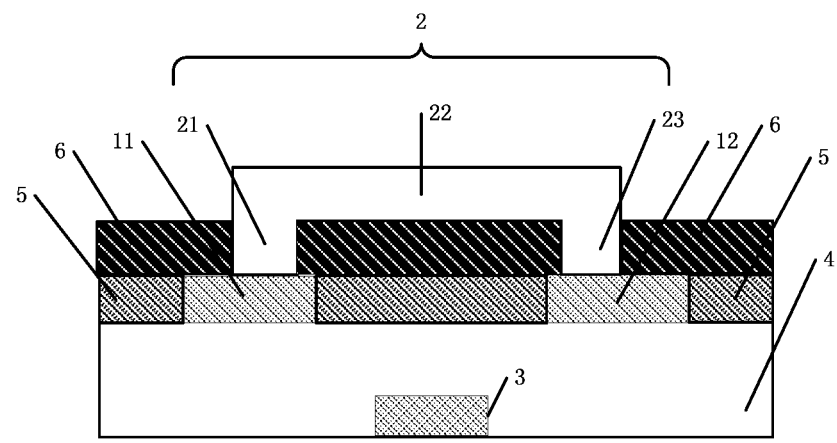
FIG. 2 is a cross-sectional view of the panel structure of the flat display in accordance with another embodiment.

FIG. 2 is a cross-sectional view of the panel structure of the flat display in accordance with another embodiment. FIG. 2 is the enhanced structure on the basis of the panel structure of FIG. 1.

The panel structure includes the first signal line 11, the second signal line 12, the transparent conductive film 2, and the scanning line 3 in FIG. 1. In addition, the panel structure includes a gate insulation layer 4, a passivation layer 5, and a photoresist layer 6, wherein:

The gate insulation layer 4 is deposited on the predetermined substrate of the scanning line 3. The passivation layer 5 is deposited on the gate insulation layer 4, and the photoresist layer 6 is deposited on the passivation layer 5. The thickness of the photoresist layer 6 may be in a range of 1 um and 1.5 um, the thickness of the passivation layer 5 is in the range of (300+n) um or (300−n) um, wherein n is a real number larger than 0 and smaller than 50, and the thickness of the gate insulation layer 4 is in the range of (500+n) um or (500−n) um, wherein n is a real number larger than 0 and smaller than 50.

In the embodiment, the photoresist layer 6 includes the red, green, and blue photoresist.

In the embodiment, the passivation layer 5 relates to a dielectric film deposited or generated on the surface of the wafer or semiconductor chip, which may prevent the surfaces from being contaminated or damaged. In the embodiment, the thickness of the passivation layer 5 is in the range of (300+n) um or (300−n) um, wherein n is a real number larger than 0 and smaller than 50. It can be understood that the surface of the semiconductor surface is fragile to the environment or the material contacted therewith.

In the embodiment, surface contamination ions, interface state charges, mobile charges and fixed charges may affect the potential of the dielectric surface of the semiconductor, causing the carrier accumulation, depletion or inversion of the surface layer. This may also cause metal-insulator-semiconductor structure capacitance-voltage characteristics and changes in the characteristics of semiconductor devices. In order to ensure the stability and reliability of the semiconductor device, the surface of the semiconductor device has to be covered by selected dielectric film. Early adopted passivation film is thermally grown silicon dioxide. However, silicon oxide film cannot stop the proliferation of alkali metal ions such as sodium. Nowadays, silica-PSG composite film, silicon dioxide-silicon nitride composite film, silica-alumina composite film or polyimide film have been widely adopted. The passivation film directly contacting with the silicon is generally called a wafer passivation film. In order to improve the passivation effect, sometimes, the chip has to be coated with the passivation film before being encapsulated, which is known as the secondary passivation film. The polyimide may also be adopted as the secondary passivation film.

In the embodiment, the gate insulation layer 4 is an insulation layer, and the thickness of the gate insulation layer 4 is in the range of (500+n) um or (500−n) um, wherein n is a real number larger than 0 and smaller than 50.

Alternatively, the transparent conductive film 2 is the arch-shaped frame having the first branch 21, the second branch 22, and the third branch 23 made by the transparent conductive film 2. The first end of the first branch 21 and the first end of the second branch 22 are connected by the predetermined first angle, and the second end of the second branch 22 and the first end of the third branch 23 are connected by the predetermined second angle. The predetermined first angle and the predetermined second angle are in the range between 30 and 60 degrees.

As shown in FIG. 2, the gate insulation layer 4 is deposited on the predetermined substrate of the scanning line 3. The passivation layer 5 is deposited on the gate insulation layer 4, and the photoresist layer 6 is deposited on the passivation layer 5. The thickness of the photoresist layer 6 may be in a range of 1 um and 1.5 um, the thickness of the passivation layer 5 is in the range of (300+n) um or (300−n) um, wherein n is a real number larger than 0 and smaller than 50, and the thickness of the gate insulation layer 4 is in the range of (500+n) um or (500−n) um, wherein n is a real number larger than 0 and smaller than 50. In the embodiment, the range of the thickness of the photoresist layer 6, the passivation layer 5, and the gate insulation layer 4 is optimized so as to form the insulation layer having good insulation effect, which enhances the display performance.

Figure 3:
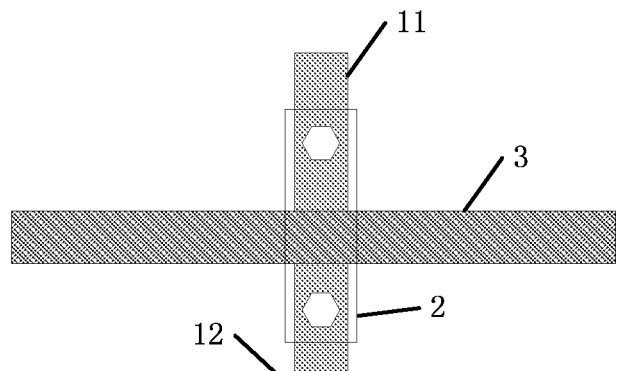
FIG. 3 is a top view of the panel structure of FIG. 2.

FIG. 3 is a top view of the panel structure of FIG. 2. The panel structure of FIG. 3 includes the first signal line 11, the second signal line 12, the transparent conductive film 2, the scanning line 3, the gate insulation layer 4, the passivation layer 5, and the photoresist layer 6 of FIG. 2. As FIG. 3 is a top view of the panel structure of FIG. 2, the photoresist layer 6, the passivation layer 5, and the gate insulation layer 4 are not shown in FIG. 3. As shown in FIG. 3, the signal line has not intersected with the scanning line in the overlap portion of the signal line and the scanning line, and the arch-shaped frame formed by the transparent conductive film connects the first signal line and the second signal line. As the transparent conductive film 2 is the arch-shaped frame made by the first branch, the second branch, and the third branch, such configuration may increase the distance between the signal line and the scanning line. The parasitic capacitance generated in the overlap portions of the signal line and the scanning line may be decreased so as to enhance the display performance.

Figure 4:
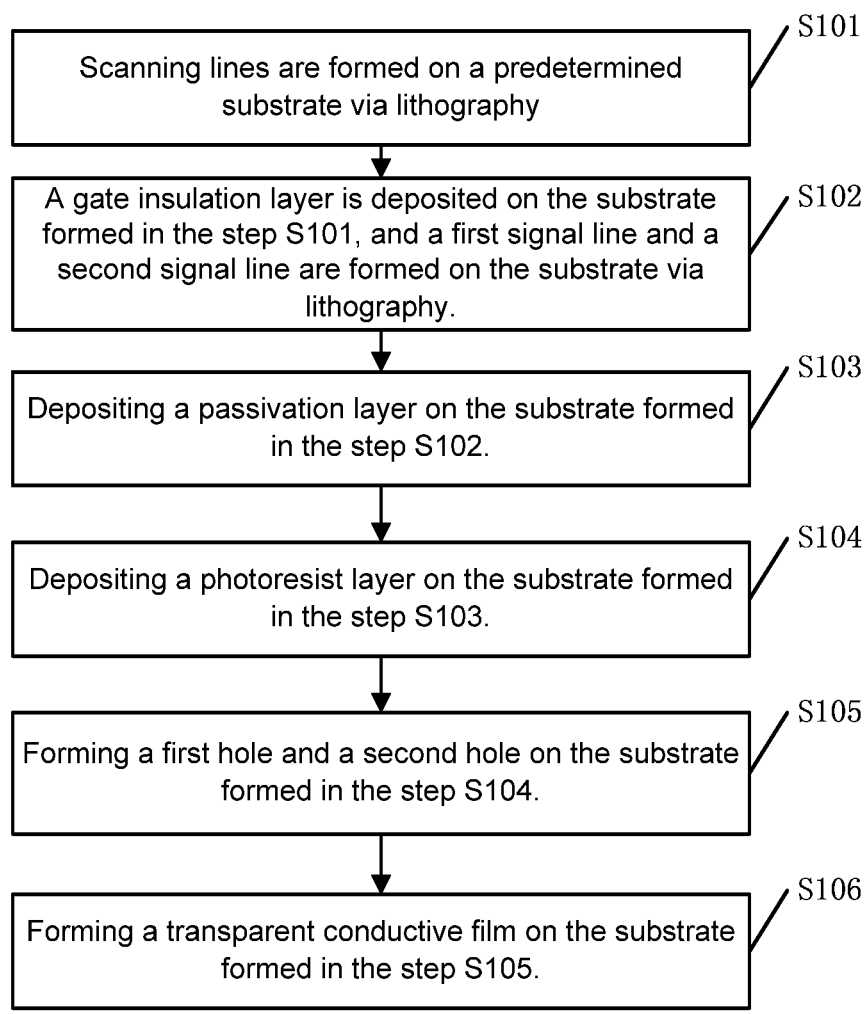
FIG. 4 is a manufacturing method of the panel structure of flat displays in accordance with one embodiment.

FIG. 4 is a manufacturing method of the panel structure of flat displays in accordance with one embodiment. The manufacturing method of the panel structure includes the following steps.

In step S101, scanning lines are formed on a predetermined substrate via lithography.

In step S102, a gate insulation layer is deposited on the substrate formed in the step S101, and a first signal line and a second signal line are formed on the substrate via lithography.

In step S103, depositing a passivation layer on the substrate formed in the step S102.

In step S104, depositing a photoresist layer on the substrate formed in the step S103.

In step S105, forming a first hole and a second hole on the substrate formed in the step S104.

In step S106, forming a transparent conductive film on the substrate formed in the step S105.

In the embodiment, the transparent conductive film 2 is a film, which is electrically conductive and includes a high transmission rate within the range of visible lights, such as a metal film, an oxide film, other compounded films, a polymer film, a composite film, and etc. The metal film is characterized by good electrical conduction, but bad transmission rate, and the semiconductor film is characterized by bad electrical conduction and high transmission rate. Currently, the most widely used films are metal film and an oxide film. The transparent conductive film is mainly used for the photovoltaic device (e.g., thin film solar cells, etc.) Common transparent conductive thin film is ITO, wherein the main ingredient of ITO is indium tin oxide. When the thickness is only a few thousand angstroms, indium oxide has high transmittance rate, and tin oxide has high conductive ability. ITO glasses are the conductive glasses having high transmittance. Because ITO is highly absorbent, it will absorb moisture and carbon dioxide in the air and produce a chemical reaction and deterioration, commonly known as "moldy," and thus the moisture issue has to be considered. ITO has appropriate shielding effectiveness within the range of 150 KHz~1 GHz, and the transparency of ITO is much better than common mesh material shielding glass, such as the light transmission rate can reach more than 85%.

In one embodiment, the thickness of the gate insulation layer is larger than the thickness of the scanning line. That is, the gate insulation layer completely covers the scanning line. The thickness of the gate insulation layer is larger than the thickness of the signal line. That is, the gate insulation layer completely covers the signal line. The thickness of the photoresist layer may be compatible with the length of the first branch and the second branch of the transparent conductive film.

The gate insulation layer 4 is deposited on the predetermined substrate of the scanning line 3. The passivation layer 5 is deposited on the gate insulation layer 4, and the photoresist layer 6 is deposited on the passivation layer 5. The thickness of the photoresist layer 6 may be in a range of 1 um and 1.5 um, the thickness of the passivation layer 5 is in the range of (300+n) um or (300−n) um, wherein n is a real number larger than 0 and smaller than 50, and the thickness of the gate insulation layer 4 is in the range of (500+n) um or (500−n) um, wherein n is a real number larger than 0 and smaller than 50.

In the embodiment, the photoresist layer 6 includes the red, green, and blue photoresist.

In the embodiment, surface contamination ions, interface state charges, mobile charges and fixed charges may affect the potential of the dielectric surface of the semiconductor, causing the carrier accumulation, depletion or inversion of the surface layer. This may also cause metal-insulator-semiconductor structure capacitance-voltage characteristics and changes in the characteristics of semiconductor devices. In order to ensure the stability and reliability of the semiconductor device, the surface of the semiconductor device has to be covered by selected dielectric film. Early adopted passivation film is thermally grown silicon dioxide. However, silicon oxide film cannot stop the proliferation of alkali metal ions such as sodium. Nowadays, silica-PSG composite film, silicon dioxide-silicon nitride composite film, silica-alumina composite film or polyimide film have been widely adopted. The passivation film directly contacting with the silicon is generally called a wafer passivation film. In order to improve the passivation effect, sometimes, the chip has to be coated with the passivation film before being encapsulated, which is known as the secondary passivation film. The polyimide may also be adopted as the secondary passivation film.

In the embodiment, the gate insulation layer 4 is an insulation layer, and the thickness of the gate insulation layer 4 is in the range of (500+n) um or (500−n) um, wherein n is a real number larger than 0 and smaller than 50.

In the present disclosure, by configuring an arch-shaped frame, which is made by a transparent conductive film, to connect a first signal line and a second signal line in the overlap location of the signal line and the scanning line. In this way, the distance between the signal line and the scanning line is increased. The parasitic capacitance generated in the overlap portions of the signal line and the scanning line may be decreased so as to enhance the display performance.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A panel structure of flat displays, comprising:
    a first signal line, a second signal line, a transparent conductive film, and a scanning line, the transparent conductive film comprises a first branch, a second branch, and a third branch, a first end of the first branch and a first end of the second branch are connected by a predetermined first angle, a second end of the second branch and a first end of the third branch are connected by a predetermined second angle, the first branch, the second branch, and the third branch form the arch-shaped frame, the first signal line connects to the second end of the first branch, the second signal line connects to the second end of the third branch, the scanning line passes through the arch-shaped frame along a first direction and has not intersected with the arch-shaped frame.

2. The panel structure as claimed in claim 1, wherein the panel structure further comprises a gate insulation layer deposited on a predetermined substrate of the scanning line.

3. The panel structure as claimed in claim 2, wherein the panel structure further comprises a passivation layer deposited on the gate insulation layer.

4. The panel structure as claimed in claim 3, wherein the panel structure further comprises a photoresist layer deposited on the passivation layer.

5. The panel structure as claimed in claim 4, wherein a thickness of the photoresist layer is in a range between 1 and 1.5 um.

6. The panel structure as claimed in claim 3, wherein a thickness of the passivation layer is in a range of (300+n) um or (300−n) um, wherein n is a real number larger than 0 and smaller than 50.

7. The panel structure as claimed in claim 2, wherein a thickness of the gate insulation layer is in a range of (500+n) um or (500−n) um, wherein n is a real number larger than 0 and smaller than 50.

8. The panel structure as claimed in claim 1, wherein the predetermined first angle and the predetermined second angle are in the range between 30 and 60 degrees.

9. A manufacturing method of panel structure of flat displays, comprising:
    step 1: forming scanning lines on a predetermined substrate via lithography;
    step 2: depositing a gate insulation layer on the substrate formed in step 1, and forming a first signal line and a second signal line on the substrate via lithography;
    step 3: depositing a passivation layer on the substrate formed in the step 2;
    step 4: depositing a photoresist layer on the substrate formed in the step 3;
    step 5: forming a first hole and a second hole on the substrate formed in the step 4; and
    step 6: forming a transparent conductive film on the substrate formed in the step 5.

10. The manufacturing method as claimed in claim 9, wherein a thickness of the gate insulation layer is in a range of (500+n) um or (500−n) um, wherein n is a real number larger than 0 and smaller than 50.

11. The manufacturing method as claimed in claim 9, wherein a thickness of the passivation layer is in a range of (300+n) um or (300−n) um, wherein n is a real number larger than 0 and smaller than 50.

12. The manufacturing method as claimed in claim 9, wherein a thickness of the photoresist layer is in a range between 1 and 1.5 um.

13. The manufacturing method as claimed in claim 9, wherein the predetermined first angle and the predetermined second angle are in the range between 30 and 60 degrees.

14. The manufacturing method as claimed in claim 9, wherein the transparent conductive film comprises a first branch, a second branch, and a third branch, a first end of the first branch and a first end of the second branch are connected by a predetermined first angle, a second end of the second branch and a first end of the third branch are connected by a predetermined second angle, the first branch, the second branch, and the third branch form the arch-shaped frame.

\* \* \* \* \*